(12) United States Patent
Nakano et al.

(10) Patent No.: US 6,352,813 B2
(45) Date of Patent: *Mar. 5, 2002

(54) PHOTOSENSITIVE RESIN COMPOSITION AND PATTERNING METHOD USING THE SAME

(75) Inventors: Kaichiro Nakano; Katsumi Maeda; Shigeyuki Iwasa; Etsuo Hasegawa, all of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,916

(22) Filed: Jun. 23, 1998

(30) Foreign Application Priority Data

Jun. 23, 1997 (JP) ................................. 9-166068

(51) Int. Cl.$^7$ ................................. G03F 7/032
(52) U.S. Cl. .............. 430/280.1; 430/325; 430/330
(58) Field of Search ............... 430/280.1, 325, 430/330

(56) References Cited

U.S. PATENT DOCUMENTS

| 5,362,597 A | * 11/1994 | Sano et al. | 430/191 |
| 5,580,694 A | * 12/1996 | Allen et al. | 430/270.1 |
| 5,738,975 A | * 4/1998 | Nakano et al. | 430/280.1 |

FOREIGN PATENT DOCUMENTS

JP   07-199467 A   * 8/1995

\* cited by examiner

*Primary Examiner*—Cynthia Hamilton
(74) *Attorney, Agent, or Firm*—Sughrue Mion, PLLC

(57) ABSTRACT

A photosensitive resin composition in accordance with the present invention has (a) a polymer having repetition units expressed by a general formula (1):

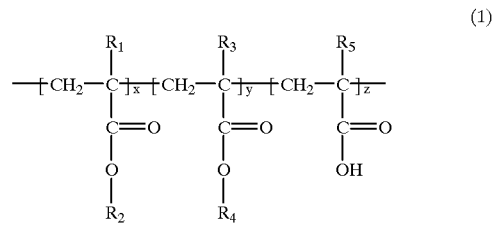

wherein $R_1$, $R_3$, and $R_5$ each represents a hydrogen atom or a methyl group, $R_2$ represents a bridged cyclic hydrocarbon group having a carbon number in the range of 7 to 22 inclusive, $R_4$ represents a hydrocarbon group including an epoxy group, $x+y+z=1$, wherein $0<x\leq0.7$, $0<y<1$, $0<z<1$, and the polymer has a weight averaged molecular weight of 1,000 to 500,000, and (b) a photo acid generator, the weight ratio between (a) and (b) being 75 to 99.8 weight parts of (a) to 0.2 to 25 weight parts of (b). This composition may include a multi-functional epoxy compound. This composition is deposited on a substrate to be worked, and after heating, the composition is exposed to an activating irradiation, and then, a heat treatment is carried out, and further, the composition is developed so as to form a pattern. This composition is excellent in the transparency to a far ultraviolet ray, and shows a high sensitivity and a high resolution to the exposure light of the far ultraviolet ray.

9 Claims, 1 Drawing Sheet

PHOTOSENSITIVE RESIN COMPOSITION AND PATTERNING METHOD USING THE SAME

BACKGROUND OF THE INVENTION

1. Field of the Invention

The present invention relates to a photosensitive resin composition suitable to a photolithography using an activating radiation such as a far ultraviolet ray, an electron beam, an ion beam and an X-ray in a semiconductor manufacturing process, and a patterning method using the same.

2. Description of Related Art

In the manufacturing of various semiconductor devices typified by a dynamic random access memory (DRAM), the demand for elevation of the density and the integration of the device is now increased more and more. In order to fulfill this demand, it is indispensable to microminiaturize the pattern. Therefore, the request for the photolithography is now becoming severe more and more.

One means for microminiaturizing the pattern is to shorten the wave length of an exposing light used in the patterning. At present, the manufacturing of DRAMs having the integration degree of not less than 1 G bits (patterning size of not larger than 0.2 $\mu$m) requires a fine patterning, which requires a light source having a short wavelength. The photolithography using an ArF excimer laser (wavelength is 193 nm) is now actively researched.

A resist material, which is a pattern forming material used in this fine patterning, is required to have high sensitivity in addition to a high resolution corresponding to the size of the fine patterning. The reason for this is that, in order to reduce a damage to optical members such as lens in an exposure machine, it is necessary to form a desired pattern with a relatively low exposure amount. In addition, particularly when the exposure light source such as the excimer laser is used, since the life of the gas which is a laser oscillation material is short, and since the laser apparatus is expensive, it is necessary to elevate the cost performance of the laser.

As a method for enhancing the sensitivity of the resist, there is used a chemically amplified resist using a photo acid generating agent such as a photo cation generating agent, which generates acid in response to exposure of the activating radiation, as a photosensitive agent. For example, Japanese Patent Application Postexamination Publication No. JP-B-02-027660 discloses a resist composed of a combination of triphenylsulfoniumhexafluoroaresenate and poly(p-ter-butoxycarbonyloxy-α-methylstrene. The chemically amplified resist is characterized in that the photo acid generating agent, which is a material included in the photo acid generating agent and generating acid in response to the light radiation, generates a proton acid, and with a heating treatment after the exposure, the proton acid thus generated is caused to move in a resist solid state, to amplify a chemical reaction of the resist resin by a catalytic reaction up to hundreds times to thousands times. Thus, a remarkably high sensitivity can be attained in comparison with the prior art having the optical reaction efficiency (reaction per one photon) of smaller than 1 (one). At present, most of newly developed resist is a chemical amplified resist, and a chemical amplification mechanism has to be adopted in developing a high sensitive material meeting with a shortened wavelength of the exposure light source.

In the prior art lithography technique using an exposure light having the wavelength longer than that of an KrF excimer laser (248 nm), the photosensitive resin composition includes the resin component typified by a resin, such as a novolak resin and poly(p-vinylphenol), containing an aromatic ring in unit structures. However, the light absorption by the aromatic ring of the light having the wavelength of not greater than 220 nm is extremely strong, and therefore, these prior art resins cannot be used as they are, for the exposure light having the wavelength of not greater than 220 nm. (Namely, a major portion of the exposure light is absorbed at a surface of the resist, so that the exposure light does not reach a substrate, with the result that a fine patterning of the resist cannot be attained) (Sasago et al "ArF excimer laser lithography (3) —Evaluation of Resist—", 36th Applied Physics Institution Conference Manuscripts, 1p-K-4, 1989). Therefore, a resin material having no aromatic ring but having an etching resistance is required.

For example, as a polymer having a transparency to the light having the wavelength of 193 nm and a dry etching resistance, there are proposed a copolymer having adamantylmethacrylate units which are alicyclic polymer (S. Takechi et al, Journal of Photopolymer Science and Technology, Vol. 5, No. 3, pp439–446, 1992, and Japanese Patent Application Pre-examination Publication No. JP-A-05-265212), a poly(norbornylmethacrylate (M. Endo et al, Proceedings of IEDM, CA14–18, 1992 (San Francisco)), a copolymer having isobornylmethacrylate units (G. M. Wallraff et al, Journal of Vacuum Science and Technology, B11(6), pp2783–2788, 1993), and a copolymer having poly (menthylmethacrylate) units (Japanese Patent Application Pre-examination Publication No. JP-A-08-08–2925). Furthermore, the co-inventors of this application proposes a polymer having a transparency to the light having the wavelength of not greater than 200 nm and a dry etching resistance and also having a difference in solubility between a pre-exposure and a post-exposure, and a photosensitive resin composition using the same (Japanese Patent Application Pre-examination Publication No. JP-A-08-259626). In addition, a 0.16 $\mu$m line-and-space pattern was formed on this photosensitive resin by using a ArF excimer laser experimental machine (Nikon lens, numerical aperture=0.6) (K. Maeda et a, Proceedings of SPIE, Vol.2724, pp377–395).

However, all of the above mentioned resist materials are a positive resist, and no negative resist of chemical amplification type for an ArF excimer laser exposure has yet been reported. In a future development of DRAMs, it is required to develop a negative resist on a rush basis The background of requiring the negative resist is that a recent elevated expectation of a multimedia information society needs a DRAM having a large capacity and a high operation speed, with the result that it is considered to be of necessity to install the DRAM and a logic circuit on the same single chip so as to realize a high speed operation and a high performance. Namely, since the negative resist is more advantageous than the positive resist, in a forming of an isolated pattern, it is indispensable to form the logic pattern. Furthermore, in the lithography in the process of manufacturing a DRAM of 1 giga bits or more, use of a phase shift mask is indispensable, and a phase shift mask can be easily formed in the negative resist, in comparison with the positive resist. As mentioned above, the negative resist is required more and more in future. However, as mentioned above, there is no report of the negative resist having a high transparency to the light having the wavelength of 193 nm and a high resolution, and an early development is required. Many negative resists meeting with the KrF excimer laser having wavelength of 193 nm have been reported and developed, however, since those negative resists include an unsaturated bond such as an aromatic ring in the resin and a crosslinking agent, those negative resists are not transparent to the light having the wavelength of 193 nm which is the wavelength of the ArF excinier laser, and therefore, cannot be used.

SUMMARY OF THE INVENTION

Accordingly, the present invention has an object to provide a sensitive resin composition which has a high transparency to the light in a far ultraviolet region and a high sensitivity and a high resolution to an exposure light of a far ultraviolet ray.

The present invention also has an object to provide a sensitive resin composition suitable to a negative photoresist using the ArF excimer laser as an exposure light.

Furthermore, the present invention has an object to provide a patterning method capable of forming a fine pattern necessary for a semiconductor manufacturing.

The co-inventors found out that the above mentioned objects can be achieved by the sensitive resin composition and patterning method which will be described in the following, and invented the present invention.

The sensitive resin composition in accordance with the present invention has a 75 to 99.8 weight part of polymer having repetition units expressed by a general formula (1):

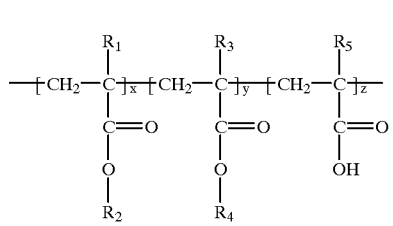

(1)

where $R_1$, $R_3$ and $R_5$, represent one of a hydrogen atom and a methyl group, $R_2$ represents a bridged cyclic hydrocarbon group having a carbon number in the range of 7 to 22 inclusive, $R_4$ represents a hydrocarbon group including an epoxy group, $x+y+z=1$, wherein $0<x\leq 0.7$, $0\leq y<1$, $0<z\leq 1$), and the polymer has a weight averaged molecular weight of 1,000 to 500,000, and 0.2 to 25 weight part of photo acid generator Furthermore, the sensitive resin composition in accordance with the present invention has a 75 to 99.8 weight part of polymer having repetition units expressed by a general formula (1):

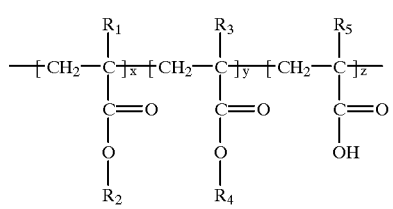

(1)

where $R_1$, $R_3$, and $R_5$ represent one of a hydrogen atom and a methyl group, $R_2$ represents a bridged cyclic hydrocarbon group having a carbon number in the range of 7 to 22 inclusive, $R_4$ represents a hydrocarbon group including an epoxy group, $x+y+z=1$, wherein $0<x\leq 0.7$, $0\leq y<1$, $0<z\leq 1$), and the polymer has a weight averaged molecular weight of 1,000 to 500,000, and 0.2 to 25 weight part of photo acid generator, and a multi-functional epoxy compound of 0.5 to 60 weight parts per 100 parts of the whole composition including the multi-functional epoxy compound itself.

Furthermore, the patterning method in accordance with the present invention is characterized by depositing the sensitive resin composition in accordance with the present invention on a substrate to be worked, and heating it, and thereafter, exposing it to an activating light, conducting a heat treatment, developing it so as to form a pattern.

In the sensitive resin composition in accordance with the present invention, an aliphatic hydrocarbon residue is introduced in the repetition units of the polymer, so that the transparency to the light having the wavelength of 180 nm to 248 nm and an etching resistance is given, and the epoxy group is introduced in the repetition units of the polymer, and if necessary, the multifunctional epoxy compound is included, so that a crosslinking reaction occurs due to an acid generated by the exposure.

DESCRIPTION OF THE PREFERRED EMBODIMENTS

Figure 1A:
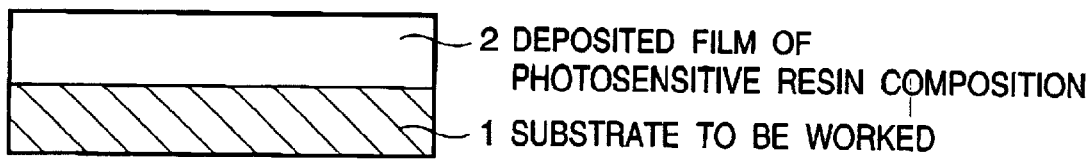
FIGS. 1A to 1D are diagrammatic sectional views for illustrating a negative pattern forming method using the sensitive resin composition in accordance with the present invention.

In the general formula (1) of the present invention, as shown in the following table 1, the bridged hydrocarbon group of $R^2$ is exemplified by tricyclo $[5.2.1.0^{2,6}]$ decyl group, norbornyl group, methylnorbornyl group, isobornyl group, tetracyclo $[4.4.0.1^{2,5}. 1^{7,10}]$ dodecyl group, methyltetracyclo $[4.4.0. 1^{2,5}. 1^{7,10}]$ dodecyl group, 2,7-dimethyltetracyclo $[4.4.0.1^{2,5}. 1^{7,10}]$ dodecyl group, 2,10-dimethyltetracyclo $[4.4.0.1^{2,5}. 1^{7,10}]$ dodecyl group, 11,12,-dimethyltetracyclo $[4.4.0.1^{2,5}. 1^{7,10}]$ dodecyl group, hexacyclo $[6.6.1. 1^{3,6}. 1^{10,13}. 0^{2,7}. 0^{9,14}]$ heptadecyl group, octacyclo $[8.8.1^{2,9}. 1^{4,7}. 1^{11,18}, 1^{13,16}. 0. 0^{3,8}. 0^{12,17}]$ dococyl group, and adamantanyl group (tricyclo $[3.3.1.1^{3,7}]$ decyl group). However, $R^2$ is in no way limited to these materials.

TABLE 1

| Name of R² | Chemical Structure of R² |
| --- | --- |
| Norbornyl Group | |
| Methylnorbornyl Group | CH₃ |
| Isobornyl Group | H₃C, CH₃, CH₃ |
| Tricyclo[5.2.1.0²,⁶]decyl Group | or |
| Tricyclo[5.2.1.0²,⁶]decylmethyl Group | or |
| Tetracyclo[4.4.0.1²,⁵.1⁷,¹⁰]dodecyl Group | |
| Methyltetracyclo[4.4.0.1²,⁵.1⁷,¹⁰]dodecyl Group | CH₃ |
| 2,7-dimethyltetracyclo[4.4.0.1²,⁵.1⁷,¹⁰]dodecyl Group | CH₃, CH₃ |
| 2,10-dimethyltetracyclo[4.4.0.1²,⁵.1⁷,¹⁰]dodecyl Group | CH₃, CH₃ |

TABLE 1-continued

| Name of $R^2$ | Chemical Structure of $R^2$ |
|---|---|
| 11,12-dimethyltetracyclo[4.4.0.1$^{2,5}$.1$^{7,10}$]dodecyl Group | |
| Hexacyclo[6.6.1.1$^{3,6}$.1$^{10,13}$.0$^{2,7}$.0$^{9,14}$]heptadecyl Group | |
| Octacyclo[8.8.1$^{2,9}$.1$^{4,7}$.1$^{11,18}$.1$^{13,16}$.0.0$^{3,6}$.0$^{12,17}$]dococyl Group | |

In addition, as shown in the following table 2, the hydrocarbon group including an epoxy group, represented by $R^4$ is exemplified by glycidyl group, 3,4-epoxy-1-cyclohexylmethyl group, 5,6-epoxy-2-bicyclo-[2.2.1] heptyl group, 5 (6)-epoxyethyl-2-bicyclo-[2.2.1]heptyl group, 5,6-epoxy-2-bicyclo-[2.2.1]heptylmethyl group, 3,4-epoxytricyclo-[5.2.1.0$^{2,6}$] decyl group, 3,4-epoxytricyclo-[5.2.1.0$^{2,6}$] decyloxyethyl group, 3,4-epoxytetracyclo-[4.4.0.1$^{2,5}$. 1$^{7,10}$] dodecyl group, and 3,4-epoxytetracyclo-[4.4.0.1$^{2,5}$. 1$^{7,10}$] dodecylmethyl group. However, $R^4$ is in no way limited to these materials.

TABLE 2

| Name of $R^4$ | Chemical Structure of $R^4$ |
|---|---|
| Glycidyl Group | —$CH_2$—CH—$CH_2$ (with O bridging) |
| 3,4-epoxy-1-cyclohexylmethyl Group | |
| 5,6-epoxy-2-bicyclo-[2.2.1]heptyl Group | |
| 5(6)-epoxyethyl-2-bicyclo-[2.2.1]heptyl Group | |
| 5,6-epoxy-2-bicyclo-[2.2.1]heptylmethyl Group | |
| 3,4-epoxytricyclo-[5.2.1.0$^{2,6}$]decyl Group | |
| 3,4-epoxytricyclo-[5.2.1.0$^{2,6}$]decyloxyethyl Group | |

TABLE 2-continued

| Name of R⁴ | Chemical Structure of R⁴ |
| --- | --- |
| 3,4-epoxytetracyclo-[4.4.0.1²,⁵1⁷,¹⁰]dodecyl Group | |
| 3,4-epoxytetracyclo-[4.4.0.1²,⁵1⁷,¹⁰]dodecylmethyl Group | |

The polymer expressed by the general formula (1) can be prepared by adding, into a tetrahydrofuran solution under atmosphere of an inert gas such as argon or nitrogen, a monomer and a radical initiator such as azobisisobutyronitrile, with a molecular ratio of monomer to initiator being 10 to 200, and heating it while agitating at a temperature of 50° C. to 70° C. for a time of 0.5 hours to 10 hours. The polymer thus obtained has an averaged polymerization degree of 10 to 500, preferably, 10 to 200, and the weight averaged molecular weight is 1000 to 500000.

A thin film of the polymer expressed by the general formula (1) (film thickness is 1.0 μm) has an excimer laser light (193 nm) transparency as high as 65% to 81%, which is practically usable.

In a thin film of the polymer having the repetition units in which in the general formula (1), $R^1$ is hydrogen atom, $R^3$ is a methyl group, and $R^2$ is tricyclo [5.2.1.0$^{2,6}$] decyl, an etching rate of a $CF_4$ gas reactive ion etching is about 185 Å/min, which is comparable to that of poly(p-vinylphenol), which is a basic polymer of the chemically amplified resist for the KrF excimer laser exposure.

Furthermore, it was confirmed that this polymer has a good adhesive property to a silicon substrate.

A basic constituents of the photosensitive resin composition in accordance with the present invention is the polymer having the repetition units expressed the general formula (1), and the photo acid generating agent generating acid in response to exposure, (which are ordinarily added with solvent), and the multifunctional epoxy compound added if necessary. The contents of the polymer and the photo acid generating agent are that the former is 75 to 99.8 weight parts and the latter is 0.2 to 25 weight parts. Preferably, the former is 85 to 99 weight parts and the latter is 1 to 15 weight parts. When the photo acid generating agent is less than 0.2 weight parts, the photosensitivity remarkably drops so that the patterning becomes difficult. When the photo acid generating agent is greater than 25 weight parts, it becomes difficult to form a uniform deposited film, and scum is easy to occur after development.

The photo acid generating agent preferably used in the present invention is a photo acid generator which generates acid in response to light having the wavelength of not greater than 248 nm. On the other hand, any photo acid generator can be used if a mixture of the polymer in the present invention and the photo acid generator can be sufficiently dissolved in an organic solvent and if the solution thus obtained can be deposited to form a uniform coating film by means of a film depositing method such as a spin coating. A single photo acid generator or a mixture of two or more photo acid generators can be used, and also can be used in combination with a suitable sensitizing agent.

When the ArF excimer laser is used, a transparency of the photo acid generating agent to the exposure light is important, similarly to the resin. The prior art photo acid generating agent having the aromatic ring typified by triphenylsulfoniumhexafluoroaresenate disclosed by JP-B-02-027660, has a strong absorption, and therefore, it is considered that the amount of usage is limited in some cases. The coinventors of this application already developed the photo acid generating agent which is relatively transparent to the ArF excimer laser and which generates aid at a high efficiency (Japanese Patent Application No. Heisei 05-174528 which was laid open as Japanese Patent Application Pre-examination Publication No. JP-A-07-025846 and Japanese Patent Application No. Heisei 05-174532 which was laid open as Japanese Patent Application Pre-examination Publication No. JP-A-07-028237, both of which corresponds to U.S. Pat. No. 5,585,507 specification).

Usable photo acid generators can be exemplified by for example triphenylsulfonium salt derivatives proposed by J. V. Crivello et al in Journal of the Organic Chemistry, Vol. 43, No. 15, pp 3055–3058, 1978, and other onium salts (compound such as sulfonium salt, iodonium salt, phosphonium salt, diazonium salt and ammonium salt, (c) 2,6-dinitrobenzyl ester proposed by T. X. Neenan et al in SPIE Proceedings, Vol. 1262, pp 32, 1990, 1,2,3-tri (methanesulfonyloxy) benzene proposed by Takumi Ueno et al in Proceedings of PME '89, pp 413–424, published through Kodansha, 1990, sulfosuccinimide disclosed in Japanese Patent Application Pre-examination Publication No. JP-A-05--134416, or the photo acid generators which are disclosed by Japanese Patent Application Nos. Heisei 05-174528 and Heisei 05-174532 and expressed by the following general formulas (2) and (3):

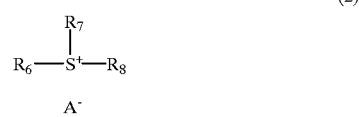

(2)

where $R^6$ and $R^7$ are a linear, branched or cyclic alkyl group, $R^8$ is a linear, branched or cyclic alkyl group, 2-oxocycloalkyl group, and 2-oxo linear or branched alkyl group, $A^-$ represents a counter ion such as $BF_4^-$, $ASF_6^-$, $SbF_6^-$, $PF_6^-$, $CF_3COO^-$, $ClO_4^-$, $CF_3SO_3^-$, alkylsulfonate, and arylsulfonate.

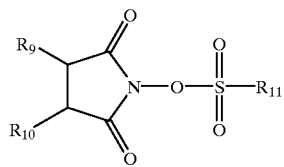

where $R^9$ and $R^{10}$ are hydrogen, or a linear, branched or cyclic alkyl group, $R^{11}$ is a linear, branched or cyclic alkyl group, or haloalkyl group typified by perfluoroalkyl such as trifluoromethyl.

When the exposure light having the wavelength of not greater than 220 nm is used, in order to elevate the light transparency of the photosensitive resin composition, it is preferred to use the photo acid generating agent expressed by the general formula (2) or (3) of the above mentioned photo acid generating agents. Namely, those photo acid generating agents have less light absorption in a far ultraviolet region from 185.4 nm to 220 nm, and therefore, those are more preferable as the constituent of the resist for the ArF excimer laser lithography from the viewpoint of the transparency to the exposure light. Specifically, there are exemplified cyclohexylmethyl(2-oxocyclohexyl) sulfonium trifluoromethanesulfonate, dicyclohexyl(2-oxocyclohexyl) sulfonium trifluoromethanesulfonate, dicyclohexylsulfonylcyclohexanone, dimethyl(2-oxocyclohexyl) sulfonium trifluoromethanesulfonate, triphenylsulfonium trifluoromethanesulfonate, diphenyliodonium trifluoromethanesulfonate, or N-hydroxysucciimide trifluoromethanesulfonate. However, the photo acid generating agents are in no way limited to these materials.

The multifunctional epoxy compound used in the present invention can be exemplified by hydorgenbisphenol A diglycidylether, ethyleneglycolglycidylether, diethyleneglycoldiglycidylether, propyleneglycoldiglycidylether, tripropyleneglycoldiglycidylether, neopentylglycoldiglycidylether, 1,6-hexanedioldiglycidylether, glycerinediglycidylether, trimethylolpropanetriglycidylether, 1,2-cyclohexancarboxylic acid diglycidylester, 3,4-epoxycyclohexanecarboxylic acid, 3,4-epoxycyclohexylmethyl, trisepoxypropylisocyanurate, 2-epoxyethylbicyclo[2.2.1] heptylglycidylether, ethylenegylcolbis(2-epoxyethylbicyclo[2.2.1] heptyl)ether, bis(2-diepoxyethylbicyclo[2.2.1] heptyl)ether. However, the multifunctional epoxy compound is in no way limited to these materials. The contents of the multifunctional epoxy compound is ordinarily 0.5 to 60 weight parts per 100 weigh parts of the whole composition including the multifunctional epoxy compound itself, and preferably, is 1 to 50 weight parts. The multifunctional epoxy compound may be composed of either a single multifunctional epoxy compound or a combination of two or more multifunctional epoxy compounds.

The solvent preferably used in the present invention may be any organic solvent if the solvent can sufficiently dissolve the polymer and an alkylsulphonium salt, and if the solution thus obtained can be deposited to form a uniform coating film by means of a spin coating and another. The solvent may be composed of either a single solvent or a combination of two or more solvents. Specifically, the solvent can be exemplified by n-propyl alcohol, isopropyl alcohol, n-butyl alcohol, terbutyl alcohol, methylcellosolve acetate, ethylcellosolve acetate, propyleneglycol monoethylether acetate, methyl lactate, ethyl lactate, 2-ethoxybutyl acetate, 2ethoxy-ethyl acetate, pyrubic acid methyl, pyrubic acid ethyl, 3-methoxypropionatemethyl, 3-methoxypropionateethyl, N-methyl-2-pyrrolidinone, cyclohexanone, cyclopentanone, cyclohexanol, methylethylketone, 1,4dioxan, ethyleneglycolmonomethylether, ethyleneglycolmonomethylether acetate, ethyleneglycolmonoethylether, ethyleneglycolmonoisopropylether, diethyleneglycolmonomethylether, and diethyleneglycoldimethylether. However, the solvent is in now way limited to these materials.

If necessary, the photosensitive resin composition in accordance with the present invention can include other constituents such as surface activating agent, pigment, stabilizer, agent for enhancing application property, and dye.

When a fine patterning is conducted using the photosensitive resin composition in accordance with the present invention, a development agent is selected from a suitable organic solvent in accordance with the dissolving property to the polymer used in the present invention, or a mixture of those solvents, a alkaline solvent having a suitable concentration, a water solution including the alkaline solvent, or a mixture of the alkaline solvent. A usable organic solvent can be exemplified by ketones such as acetone, methylketone, methylisobutylketone, cyclopentanone, and cyclohexanone, alcohol such as methyl alcohol, ethyl alcohol, npropyl alcohol, isopropyl alcohol, n-butyl alcohol, isobutyl alcohol, terbutyl alcohol, cyclopentanol, cyclohexanol, and ethers such as tetrahydrofuran, dioxane, ethyl acetate, butyl acetate, isoamyl acetate, toluene, xylene, and phenol. In addition, a usable alkaline solution can be exemplified by an aqueous solution or organic solvent, containing an inorganic alkali such as sodium hydroxide, potassium hydroxide, sodium silicate, and ammonia; an organic amine such as ethylamine, propylamine, diethylamine, dipropylamine, trimethylamine and triethylamine; or an organic ammonium salt such as tetramethylammonium hydroxide, tetraethylammonium hydroxide, trimethylhydroxymethylammonium hydroxide, triethylhydroxymethylammonium hydroxide, and trimethylhydroxyethylammonium hydroxide, or alternatively, their mixture. However, the developer is in no way limited to these materials.

Figure 1B:
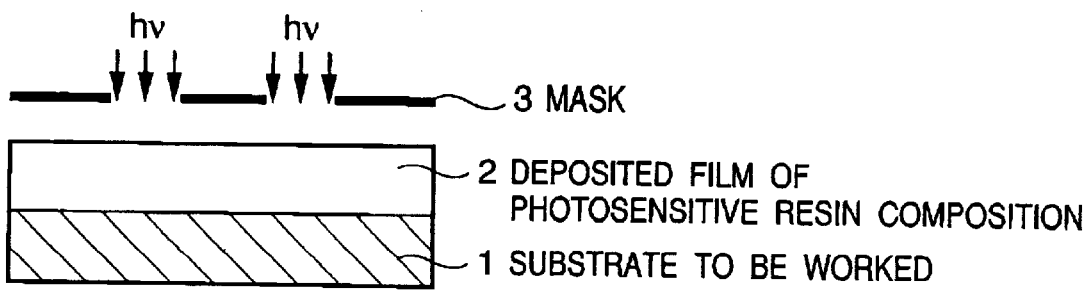
Figure 1C:
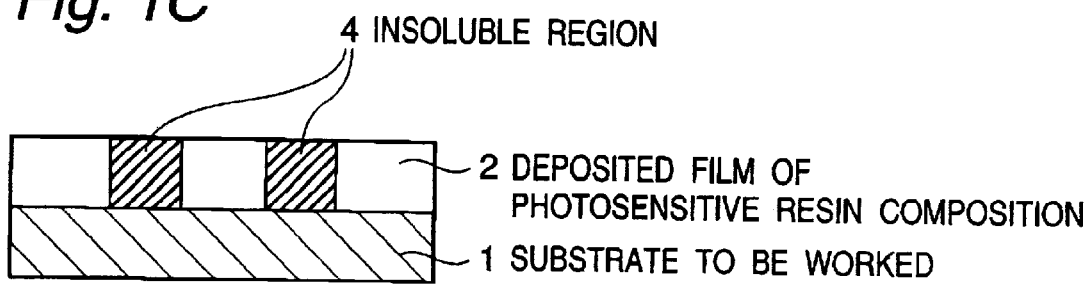
Figure 1D:
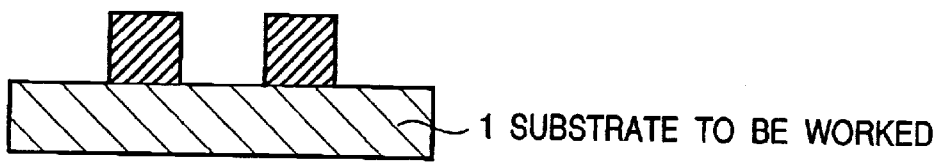

According to the present invention, there is provided a method for forming a negative pattern on a substrate to be worked, by using the photosensitive resin composition in accordance with the present invention. As shown in FIG. 1A, first, the photosensitive resin composition in accordance with the present invention is coated on a substrate 1 to be worked, by means of a spin coating, and then, a heat treatment is conducted by a hot plate at a temperature of 60° C. to 170° C. for 30 seconds to 240 seconds, so that a deposited film 2 of the photosensitive resin composition is formed. Thereafter, the ArF excimer laser is selectively irradiated by a mask 3 as shown in FIG. 1B. Succeedingly, the post exposure baking is conducted to the deposited film 2 of the photosensitive resin composition by means of the hot plate (PEB=postexposure baking). As a result, in an exposed region of the deposited film 2 of the photosensitive resin composition, the epoxy groups causes a ring-opening polymerization by action of acid generated from the photo acid generating agent, so that the crosslinking of the resin advances (FIG. 1C). Furthermore, by using the alkaline developing liquid such as a tetramethylammonium hydroxide (TMAH) aqueous solution, the unexposed portion in the deposited film 2 of the photosensitive resin composition is dissolved and removed, so that a negative pattern is formed (FIG. 1D).

The photosensitive resin composition in accordance with the present invention can exhibit a patterning performance for the other activating ray such as a g-line and i-line of a mercury vapor lamp, an KrF excimer laser, or an electron beam, an X-ray, if a suitable photo acid generating agent or a suitable pigment for light absorption are introduced.

Now, the present invention will be described with reference to embodiments and comparative examples, but it is to be noted that the present invention is in no way limited to those embodiments.

Embodiment 1

Preparation of the polymer having the following structure (in the general formula (1), $R^1$, $R^3$ and $R^5$ are methyl group, $R^2$ is norbornyl group, and $R^4$ is 5,6-epoxy-2-bicyclo [2.2.1] heptyl group, x=0.2, y=0.3, z=0.5)

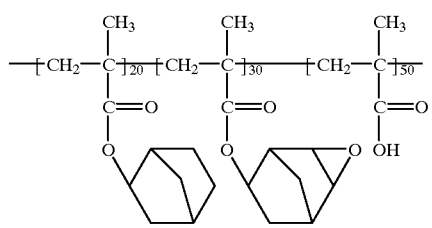

In a 100 ml round bottomed glass flask coupled with a feedback pipe having a calcium chloride pipe, 2.1 g of norbonylmethacrylate, 3.57 g of 5,6-epoxy-2-bicyclo [2.2.1] heptyl methacrylate, and 3.25 g of methacrylic acid are dissolved in 27 ml of dry tetrahydrofuran, and furthermore, 223 mg (50 mmol/l) of AIBN is added thereto and stirred at 60° C. to 65° C. After two hours, it is cooled down and the reaction mixture is poured into 300 ml of ligroin, and a separated-out precipitate is filtered. Furthermore, precipitation purification is carried out once more, so that 6.24 g of a target matter is obtained (yield of 70%). At this time, it was confirmed by $^1$HNMR that copolymerization ratio is as calculated. The weight averaged molecular weight (Mw) was 21500 and the degree of dispersion (Mw/Mn) was 2.08.

Embodiment 2

Preparation of the polymer having the following structure (in the general formula (1), $R^1$, $R^3$ and $R^5$ are methyl group, $R^2$ is tricyclo $[5.2.1.0^{2,6}]$ decylmethyl group, and $R^4$ is glycidyl group, x=0.3, y=0.3, z=0.4)

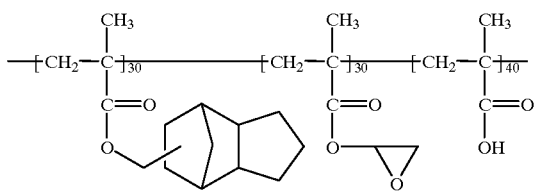

This is prepared similarly to the embodiment 1, excepting that tricyclo $[5.2.1.0^{2,6}]$ decylmethyl methacrylate (made by Hitachi Kasei Kogyo K. K.) is used in place of the norbonylmethacrylate, and glycidyl methacrylate ("Light Ester G" made by Kyoei-Sha Kagaku K. K.) is used in place of 5,6-epoxy-2-bicyclo [2.2.1] heptyl methacrylate. The weight averaged molecular weight (Mw) was 26000 and the degree of dispersion (Mw/Mn) was 2.21.

Embodiment 3

Preparation of the polymer having the following structure (in the general formula (1), $R^1$, $R^3$ and $R^5$ are methyl group, $R^2$ is tetracyclo $[4.4.0.1^{2,5}. 1^{7,10}]$ dodecyl group, $R^4$ is 3.4-epoxytricyclo $[5.2.1.0^{2,6}]$ decyl group, x=0.03, y=0.75, z=0.247)

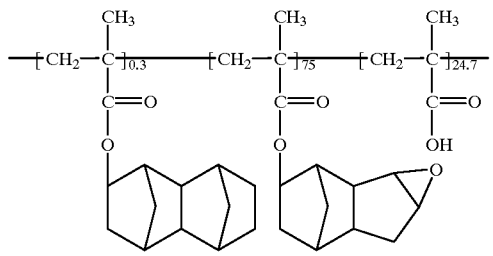

This is prepared similarly to the embodiment 1, excepting that tetracyclo $[4.4.0.1^{2,5}. 1^{7,10}]$ dodecyl methacrylate is used in place of the norbonylmethacrylate, and 3.4-epoxytricyclo $[5.2.1.0^{2,6}]$ decyl methacrylate is used in place of 5,6-epoxy-2-bicyclo [2.2.1] heptyl methacrylate. The weight averaged molecular weight (Mw) was 12050 and the degree of dispersion (Mw/Mn) was 1.70.

Embodiment 4

Preparation of the polymer having the following structure (in the general formula (1), $R^1$, $R^3$ and $R^5$ are methyl group, $R^2$ is tetracyclo $[4.4.0.1^{2,5}. 1^{7,10}]$ dodecyl group, $R^4$ is 3.4-epoxytetracyclo $[4.4.0.1^{2,5}. 1^{7,10}]$ decyl group, x=0.25, y=0.25, z=0.50)

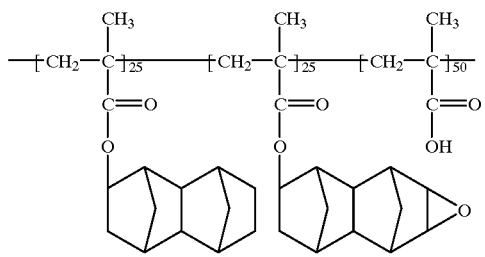

This is prepared similarly to the embodiment 1, excepting that tetracyclo $[4.4.0.1^{2,5}. 1^{7,10}]$ dodecyl methacrylate is used in place of the norbonylmethacrylate, and 3.4-epoxytetracyclo $[4.4.0.1^{2,5}. 1^{7,10}]$ decyl methacrylate is used in place of 5,6-epoxy-2-bicyclo [2.2.1] heptyl methacrylate. The weight averaged molecular weight (Mw) was 27800 and the degree of dispersion (Mw/Mn) was 1.98.

Embodiment 5

Preparation of the polymer having the following structure (in the general formula (1), $R^1$, $R^3$ and $R^5$ are methyl group, $R^2$ is hexacyclo $[6.6.1.1^{3,6}. 0^{10,13}. 0^{9,14}]$ heptadecyl group, $R^4$ is glycidyl group, x=0.3, y=0.3, z=0.4)

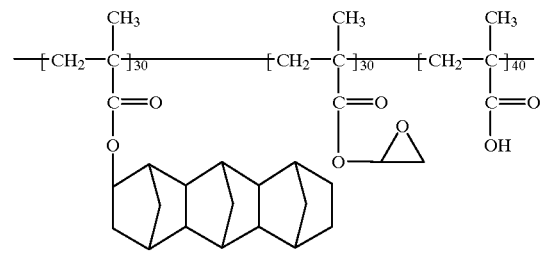

[2.2.1] heptyl methacrylate. The weight averaged molecular weight (Mw) was 28620 and the degree of dispersion (Mw/Mn) was 2.45. Embodiments 6 to 10 and Comparable examples 1 and 2.

2 g of the respective polymers obtained in the Embodiments 1 to 5 are dissolved in 10 g of ethyl lactate, and is filtered by a Teflon filter having a pore diameter of 0.2 μm, and then, is spincoated on a 3-inch silicon substrate, and further, is baked on a hot plate at 90° C. for 60 seconds, so that a thin film having a film thickness of 0.7 μm was formed. An etching rate of the film thus obtained to a $CF_4$ gas was measured by using a reactive ion etching (RE) machine DEM451 made by Nichiden Aneruba (under the etching condition of power=100 W, pressure=5 Pa and gas flow rate=30 sccm). The result is shown in the following table 3.

Incidentally, as a comparative example 1, when the deposited film was formed by poly(p-vinylphenol) which is frequently used as a basic resin for the resist of the KrF excimer laser lithography, the result is shown in the table 3. As a comparative example 2, when the deposited film was formed by polymethylmethacrylate which is a polymer having no bridged cyclic hydrocarbon group in its molecular structure, the result is also shown in the table 3. The polymer obtained in accordance with the present invention shows the etching rate slower than that of the poly(methylmethacrylate). In addition, the polymer obtained in accordance with the present invention shows the etching rate comparable to or slower than that of poly(p-vinylphenol). In other words, it would be apparent that the polymer obtained in accordance with the present invention has a sufficient etching resistance as the resist material.

TABLE 3

| Embodiment | Polymer | Etching rate (Å/min) |
|---|---|---|
| 6 | polymer of Embodiment 1 | 175 |
| 7 | polymer of Embodiment 2 | 170 |
| 8 | polymer of Embodiment 3 | 177 |
| 9 | poLymer of Embodiment 4 | 166 |
| 10 | polymer of Embodiment 5 | 163 |
| comparative 1 | poly(p-vinylphenol) | 167 |
| comparative 2 | poly(methylmethacrylate) | 262 |

Embodiment 11

The resist material having the following composition was prepared and the following experiment was carried out by using a yellow lamp:

| (a) | polymer (Embodiment 1) | 0.950 g |
|---|---|---|
| (b) | cyclohexylmethyl(2-oxocyclohexyl)sulfonium trifluoromethanesulfonate (photo acid generating agent = compound of the general formula (2)) | 0.050 g |
| (3) | ethyl lactate (solvent) | 4.000 g |

The above mixture is filtered by a 0.2 μm Teflon filter, so that the resist was prepared. The resist was spincoated on a 3-inch silicon substrate, and baked at a hot plate at 80° C. for 60 seconds so that a thin film having a film thickness of 0.71 μm was formed (FIG. 1A). The wavelength dependency of the transmittance of the film thus obtained was measured by using a ultraviolet and visible light spectrometer. The transmittance of this thin film at the wavelength of 193.4 nm was 68%, and therefore, it was confirmed that it has a sufficient transparency as a single layer resist.

Embodiment 12

The resist shown in the Embodiment 11 was exposed by using an ArF reduction exposure experimental machine (NA=0.55, σ=0.7, made by NIKON). Immediately after the exposure, the resist is baked at a hot plate at 130° C. for 90 seconds, and is immerse in an alkaline developing liquid (aqueous solution containing 2.3 weight parts of tetramethylammonium hydroxide) of 23° C. for 60 minutes, and succeedingly, is rinsed with a pure water for 60 seconds. As a result, only the exposed portion of the resist film has become insoluble, and the unexposed portion is dissolved and removed by the developing liquid, so that a negative pattern was obtained. In this experiment, when the exposure energy was about 38mJ/$cm^2$, a resolution of a 0.25 μm line-and-space pattern could be obtained. Furthermore, the obtained pattern was observed by a scan electron microscope (SEM, SE-4100 made by HITACHI). Neither an undeveloped portion nor a pealing-off of the pattern was found out.

Embodiments 13–16

The resist solution was prepared similarly to the Embodiment 11, and the exposure experiment was carried out similarly to the Embodiment 12. The result is shown in the following table 4;

TABLE 4

| Embodiment | Polymer | Added amount of multifunctional epoxy (g) | Sensitivity (mJ/$cm^2$) | Resolution (μm) |
|---|---|---|---|---|
| 13 | Polymer of Embodiment 2 | 0 | 55 | 0.24 |
| 14 | Polymer of Embodiment 3 | 0 | 5 | 0.3 |
| 15 | Polymer of Embodiment 4 | trimethylolpropane triglycidylether 0.25 | 23 | 0.22 |
| 16 | Polymer of Embodiment 5 | 1,2-cyclohexancarboxylic acid diglycidylester 0.25 | 19 | 0.20 |

As will be apparent from the above description, the photosensitive resin position in accordance with the present invention has a high transparency in a far ultraviolet region, and shows a high sensitivity and a high resolution to an exposure light of far ultraviolet ray. In other words, it is suitable to a negative photoresist using the far ultraviolet ray having the wavelength of not greater than 248 nm, particularly, the ArF excimer laser having the wavelength of 193 nm. Furthermore, by using the fine patterning method in accordance with the present invention and using the photosensitive resin composition in accordance with the present invention, it is possible to form a fine pattern required in a semiconductor device manufacturing.

What is claimed is:

1. A photosensitive resin composition comprising:
   (a) a polymer having repetition units expressed by a general formula (1):

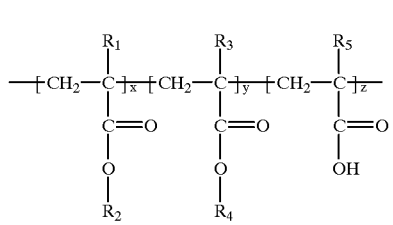

(1)

wherein,
$R_1$, $R_3$, and $R_5$ each represents a hydrogen atom or a methyl group,
$R_2$ represents a non-aromatic bridged cyclic hydrocarbon group having a carbon number in the range of 7 to 22 inclusive,
$R_4$ represents a non-aromatic hydrocarbon group including an epoxy group, $x+y+z=1$, wherein $0<x\leq0.7$, $0<y<1$, $0<z<1$, and
the polymer has a weight averaged molecular weight of 1,000 to 500,000;
   (b) a photo acid generator, the weight ratio between (a) and (b) being 75 to 99.8 weight parts of (a) to 0.2 to 25 weight of (b), and
   (c) a multi-functional epoxy compound present in an amount of 0.5 to 60 weight parts per 100 weight parts of (a) plus (b) plus (c).

2. The photosensitive resin composition of claim 1 wherein $R^2$ in the general formula (1) is composed of one selected from the group consisting of tricyclo [$5.2.1.0^{2,6}$] decyl group, norbornyl group, methylnorbornyl group, isobornyl group, tetracyclo [$4.4.0.1^{2,5}$. $1^{7,10}$] dodecyl group, methyltetracyclo [$4.4.0.1^{2,5}$. $1^{7,10}$] dodecyl group, 2,7-dimethyltetracyclo [$4.4.0.1^{2,5}$. $1^{7,10}$] dodecyl group, 2,10-dimethyltetracyclo [$4.4.0.1^{2,5}$. $1^{7,10}$] dodecyl group, 11,12,-dimethyltetracyclo [$4.4.0.1^{2,5}$. $1^{7,10}$] dodecyl group, hexacyclo [$6.6.1.1^{3,6}$. $1^{10,13}$, $0^{2,7}$. $0^{9,14}$] heptadecyl group, octacyclo [$8.8.1^{2,9}$. $1^{4,7}\cdot1^{11,18}{}^{13,16}$. $0.0^{3,8}$. $0^{12,17}$] dococyl group, and adamantanyl group.

3. The photosensitive resin composition of claim 2 wherein $R^4$ in the general formula (1) is composed of one selected from the group consisting of glycidyl group, 3,4-epoxy-1-cyclohexylmethyl group, 5,6-epoxy-2-bicyclo-[2.2.1] heptyl group, 5 (6)- epoxyethyl-2-bicyclo-[2.2.1] heptyl group, 5,6-epoxy-2-bicyclo-[2.2.1] heptylmethyl group, 3,4-epoxytricyclo-[$5.2.1.0^{2,6}$] decyl group, 3,4-epoxytricyclo [$5.2.1.0^{2,6}$] decyloxyethyl group, 3,4-epoxytetracyclo [$4.4.0.1^{2,5}$. $1^{7,10}$] dodecyl group, and 3,4-epoxytetracyclo-[$4.4.0.1^{2,5}$. $1^{7,10}$] dodecylmethyl group.

4. A patterning method including the steps of depositing on a substrate a photosensitive resin composition comprising:
   (a) a polymer having repetition units expressed by a general formula (1):

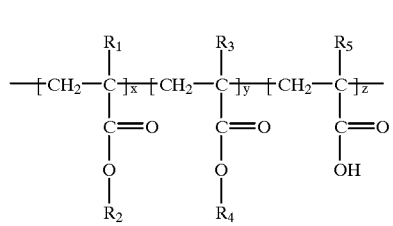

(1)

wherein,
$R_1$, $R_3$, and $R_5$ each represents a hydrogen atom or a methyl group,
$R_2$ represents a bridged cyclic hydrocarbon group having a carbon number in the range of 7 to 22 inclusive,
$R_4$ represents a hydrocarbon group including an epoxy group, $x+y+z=1$, wherein $0<x\leq0.7$, $0<y<1$, $0<z<1$), and the polymer has a weight averaged molecular weight of 1,000 to 500,000; and (b) a photo acid generator, the weight ratio between (a) and (b) being 75 to 99.8 weight parts of (a) to 0.2 to 25 weight parts of (b), heating the deposited photosensitive resin composition, exposing the deposited photosensitive resin composition to an activating irradiation, heating the deposited photosensitive composition a second time, and developing the exposed photosensitive resin composition so as to form a pattern.

5. The patterning method of claim 4 wherein said activating irradiation has the wavelength of not greater than 248 nm.

6. The patterning method of claim 5 wherein said activating irradiation is an ArF excimer laser.

7. The patterning method of claim 4, wherein said photosensitive resin composition further includes (c) a multi-functional epoxy compound present in an amount of 0.5 to 60 weight parts per 100 weight parts of (a) plus (b) plus (c).

8. The patterning method of claim 7 wherein said activating irradiation has the wavelength of not greater than 248 nm.

9. The patterning method of claim 8 wherein said activating irradiation is an ArF excimer laser.

* * * * *